United States Patent [19]
Hsu

[11] Patent Number: 6,048,797
[45] Date of Patent: Apr. 11, 2000

[54] METHOD OF MANUFACTURING INTERCONNECTS

[75] Inventor: Chen-Chung Hsu, Taichung, Taiwan

[73] Assignee: United Microelectronics Corp., Hsinchu, Taiwan

[21] Appl. No.: 09/172,333

[22] Filed: Oct. 14, 1998

[30] Foreign Application Priority Data

Jul. 23, 1998 [TW] Taiwan ................................. 87112020

[51] Int. Cl.⁷ .................................................. H01L 21/44
[52] U.S. Cl. ............................ 438/706; 438/712; 438/719; 438/720
[58] Field of Search ..................... 438/691, 692, 438/637, 638, 672, 706, 712

[56] References Cited

U.S. PATENT DOCUMENTS 5,702,982  12/1997  Lee et al. .................................. 437/195
5,854,130  12/1998  Yang et al. ............................... 438/637

*Primary Examiner*—Benjamin L. Utech
*Assistant Examiner*—Lan Vinh
*Attorney, Agent, or Firm*—Jiawei Huang; J.C. Patents

[57] ABSTRACT

A method of manufacturing interconnects disclosed in the invention comprises the following steps. First, a substrate having an insulator formed thereon is provided. A first dielectric layer having a first conductive section and a second conductive section formed therein, is formed on the insulator. A second dielectric layer is formed over the substrate and covers the first conductive line and the second conductive line. A via hole is formed in the second dielectric layer to expose parts of the first conductive section and the second conductive section and the part of the first dielectric layer therebetween. The part of the first dielectric layer between the first conductive line and the second conductive line is removed until the insulator is exposed, thereby forming a coupling hole. And, a plug is formed in the via hole and the coupling hole, wherein the plug is electrically coupled to the first conductive section and the second conductive section.

20 Claims, 4 Drawing Sheets

METHOD OF MANUFACTURING INTERCONNECTS

CROSS-REFERENCE TO RELATED APPLICATION

This application claims the priority benefit of Taiwan application serial no. 87112020, filed Jul. 23, 1998, the full disclosure of which is incorporated herein by reference.

BACKGROUND OF THE INVENTION

1. Field of the Invention

The invention relates to a method of manufacturing integrated circuits (ICs), and more particularly to a method of manufacturing interconnects.

2. Description of the Related Art

Due to the further high integrity of ICs, chips cannot provide sufficient areas for interconnections manufacturing at all. Therefore, to cooperate with the increased requirements for interconnects manufacturing after the miniaturization of MOS transistors, it is necessary for IC manufacturing to increasingly adopt a design with more than two metal layers. In particular, a number of function-complicated products, such as microprocessors, even require 4 or 5 metal layers to complete the internal connections thereof. Generally, an inter-metal dielectric (IMD) layer is used to electrically isolate two adjacent metal layers from each other. Moreover, a conductive layer used to electrically connect the two adjacent metal layers is called a via plug in semiconductor industry.

In a prior method for manufacturing a via plug in a multilevel interconnect process, a dielectric layer is first formed on a metal layer. Then, a patterned photoresist is formed on the dielectric layer. A via hole is formed in the dielectric layer by etching. Next, a conductive layer, such as a tungsten layer, is deposited in the via hole, wherein the conductive layer is a so-called via plug. Repeat the above-stated steps to completely implement a multilevel interconnects process.

However, during etching for forming the via hole, the corresponding part of the lower metal layer cannot be completely exposed through the via hole owing to poor etching. As a result, the contact resistance between the subsequently formed via plug and the lower metal is increased because of the reduced contact area therebetween after the via plug is formed. When the poor etching becomes more serious, it may even cause that the via plug is thoroughly disconnected from the lower metal layer, leading to an open circuit.

FIGS. 1A–1B shows a method of manufacturing traditional interconnects.

Referring to FIG. 1A, a substrate 100 with a planarized surface is first provided, wherein devices already formed in the substrate 100 is not shown. A conductive layer (not shown) located on the substrate 100 is patterned to form a conductive line 102. Moreover, the conductive line 102 is electrically connected to a conductive region (not show) in the substrate.

Thereafter, a dielectric layer 104, such as a silicon oxide layer, is formed over the substrate 100 by chemical vapor deposition (CVD). Planarization is performed on the dielectric layer 104 by chemical mechanical polishing until the height of the dielectric layer 104 is approximately equal to that of a subsequently formed vial hole, thereby forming a dielectric layer 104a.

Referring to FIG. 1B, a via hole 106 is formed in the dielectric layer 104a by traditional photolithography and etching. A glue/barrier layer (not shown) is formed along the surfaces of the dielectric layer 104a and the via hole 106 thereby to improve its adhesion to a subsequently formed conductive layer. Then, a conductive layer (not shown), such as a tungsten layer, is formed on the dielectric layer and completely fills the via hole 106 by chemical vapor deposition. Finally, part of the conductive layer over the surface of the dielectric layer 104a is removed by etch back or chemical mechanical polishing thereby to form a via plug 108.

However, the contact area between the conductive line 102 and the via plug 108 is greatly decreased owing to a serious poor etching. It may even cause that the via plug 108 is completely disconnected from the conductive line 102, leading to an opening circuit 110.

SUMMARY OF THE INVENTION

The invention provides a method of manufacturing interconnects. In the method, a conductive line being separated by a coupling region therein is formed by a metal damascene process. A dielectric layer is formed on conductive line and the coupling region. A via hole exposing the coupling region is formed within the dielectric layer. In addition to the coupling region, the via hole also exposes an edge portion of the conductive line. A plug is formed in the via hole in contact with the coupling region and the edge portion of the conductive line. Accordingly, an open circuit between the conductive line and the plug can be efficiently prevented. In addition, the contact area between the conductive line and the plug is increased to greatly decrease the contact resistance since the plug extends over the conductive line. In addition, an insulator layer can be formed on the substrate before forming the conductive line to provide a etch stop.

The method of manufacturing interconnects comprises the following steps. A first dielectric layer is formed on the substrate. The first dielectric layer is etched to form at least a trench which is broken into two sections by a coupling region of a part of the first dielectric layer. The trench is filled with a metal layer to form a first conductive section and a second conductive section. A second dielectric layer is formed on the first dielectric layer including the coupling region and covers the first conductive section and the second conductive section. A via hole is formed in the second dielectric layer thus exposes the coupling region and an edge portion of each of the first conductive line and the second conductive section adjacent to the coupling region and the coupling region of the second dielectric layer. The coupling region of the first dielectric layer is etched to form a contact hole under the via hole, so as to expose the substrate. As shown in the figure, since the via hole exposes not only the coupling region but also the edge portions of the first and the second conductive sections, the via hole has a larger area than that of the underlying contact hole. A plug is then filled in the via hole and contact hole. Therefore, in addition to the portion within the contact hole, there is another portion overlapped between the first and second conductive section and the plug, so as between the second conductive section and the plug. Therefore, the conductivity of the plus is greatly enhanced.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE EMBODIMENTS

Figure 1A:
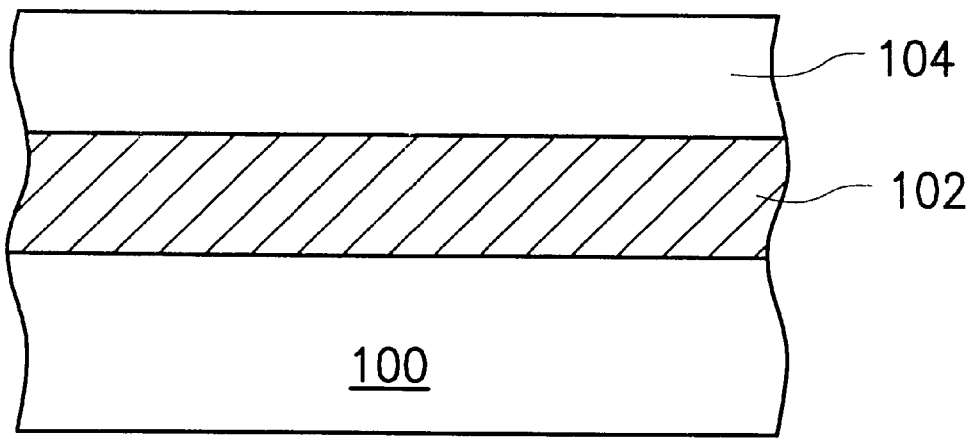
FIGS. 1A–1B are cross-sectional views illustrating a method of manufacturing traditional interconnects.
Figure 1B:
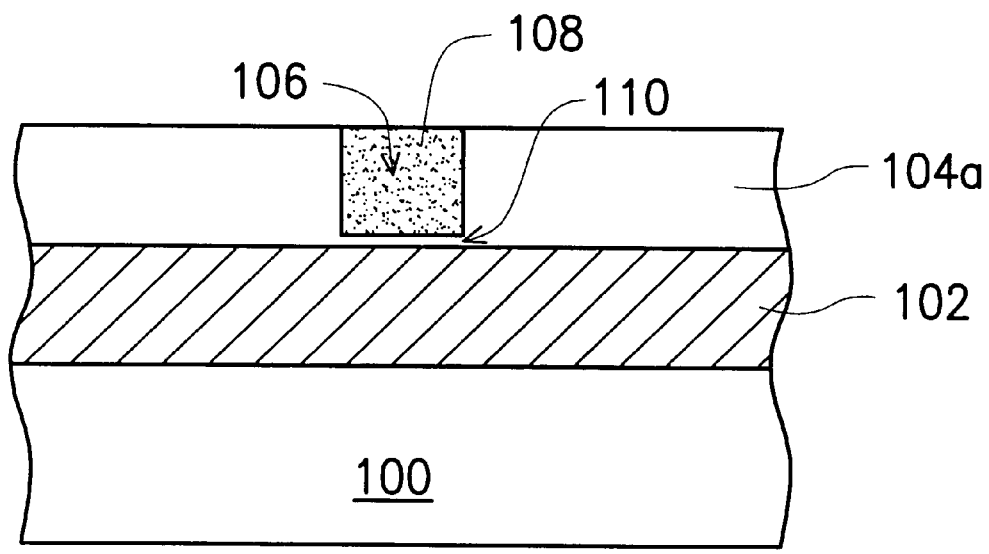
Figure 2A:
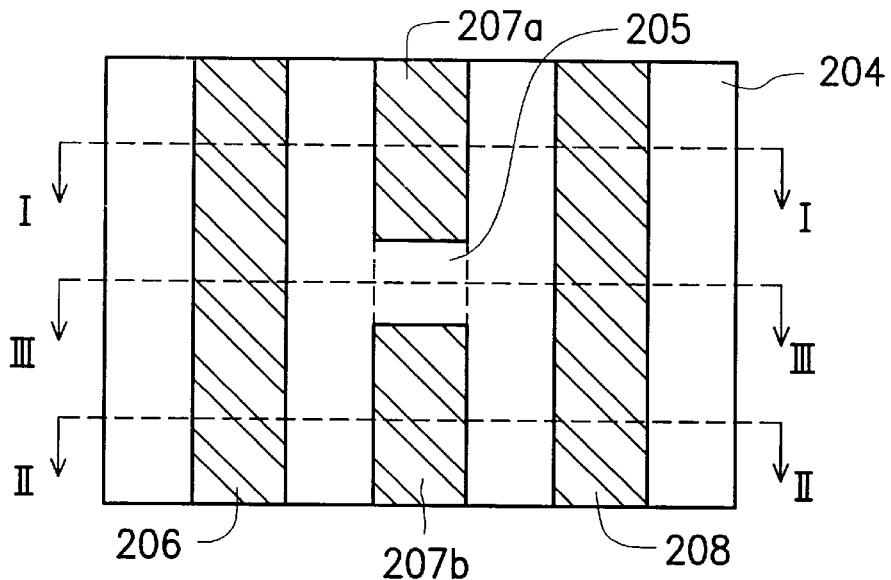
FIG. 2A is a top view of portion of interconnects manufactured according to a embodiment of the invention.
Figure 2B:
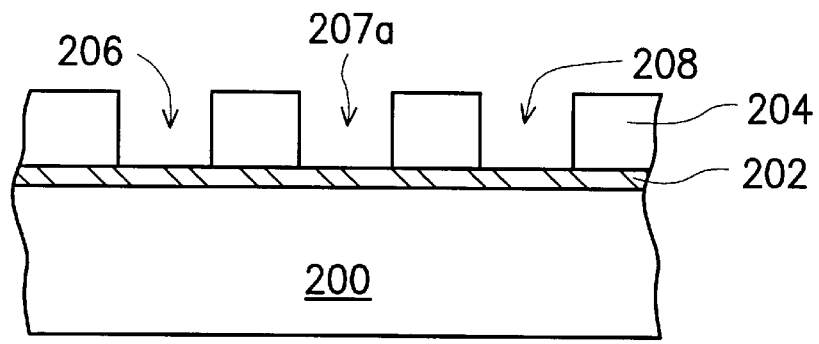
FIG. 2B is a cross-sectional view of FIG. 2A along dot line I—I.
Figure 2C:
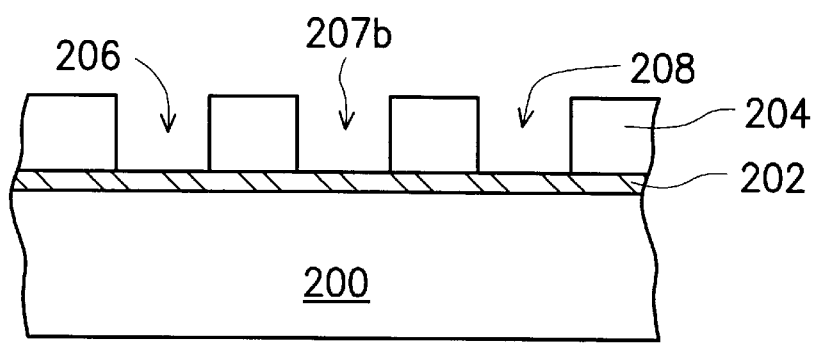
FIG. 2C is a cross-sectional view of FIG. 2A along dot line II—II.
Figure 2D:
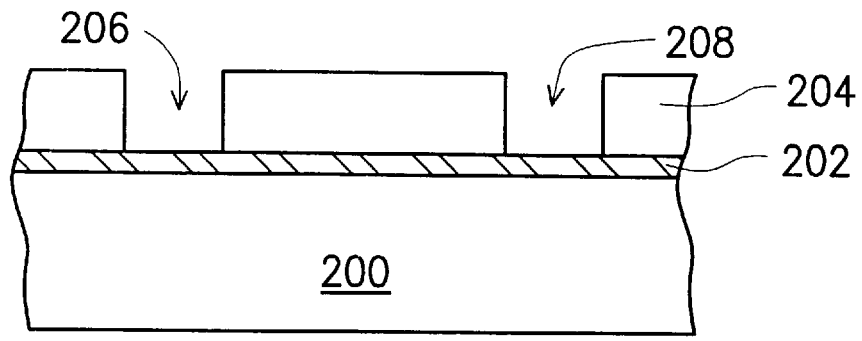
FIG. 2D is a cross-sectional view of FIG. 2A along dot line III—III.

FIG. 2A is a top view of a layout of interconnects manufactured according to an embodiment of the invention. FIG. 2B is a cross-sectional view of FIG. 2A along dot line I—I. FIG. 2C is a cross-sectional view of FIG. 2A along dot line II—II. FIG. 2D is a cross-sectional view of FIG. 2A along dot line III—III.

Referring to FIGS. 2A–2D, a substrate 200 with a planarized surface is first provided, wherein devices already formed in the substrate 200 is not shown. An insulator 202, such as a silicon nitride layer, is formed on the substrate 200 by, for example, chemical vapor deposition. The insulating layer 202 functions as an etching stop layer when subsequently forming a trench in the dual damascene process. Furthermore, the insulating layer 202 also functions as an etching stop layer when subsequently forming a via hole and a coupling region.

Next, a first dielectric layer 204, such as a silicon oxide layer, is formed on the insulator 202 by, for example, chemical vapor deposition. Then, the first dielectric layer 204 is planarized by, for example, chemical mechanical polishing, until the thickness of first dielectric layer 204 is approximately equal to the depth of a subsequently-formed trench in the dual damascene process.

Subsequently, trenches 206, 207a, 207b and 208 where a dual damascene structure will be located are formed in the first dielectric layer 204 by traditional photolithography and etching, such as RIE until the parts of the surface of the insulating layer 202 are exposed. The trenches 207a and 207b are separated by a coupling region 205, being a part of the first dielectric layer 204 and are used for subsequently forming a conductive line.

Figure 2E:
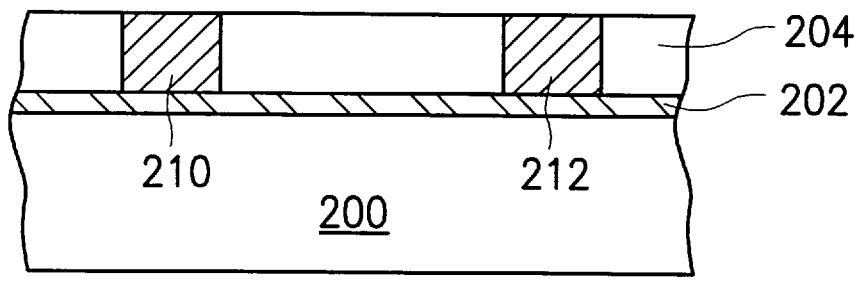
FIGS. 2E–2F are cross-sectional views along dot line III—III of FIG. 2A illustrating a method of manufacturing interconnects according to the embodiment of the invention.
Figure 2F:
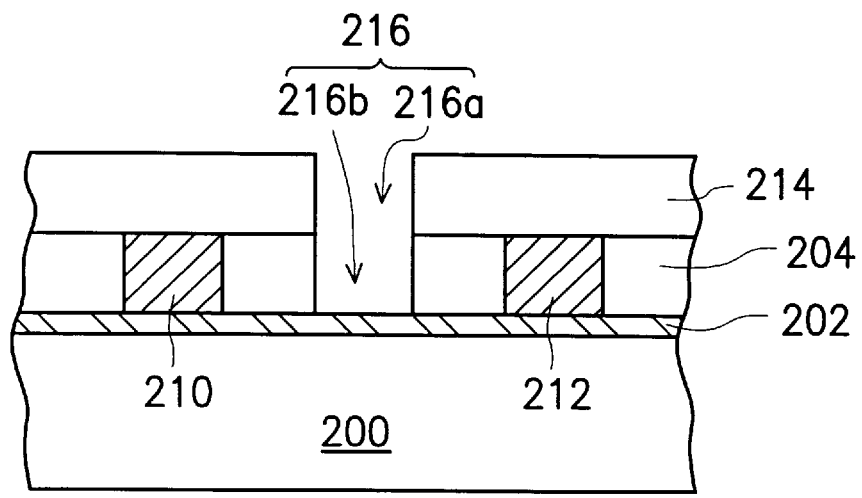
Figure 2G:
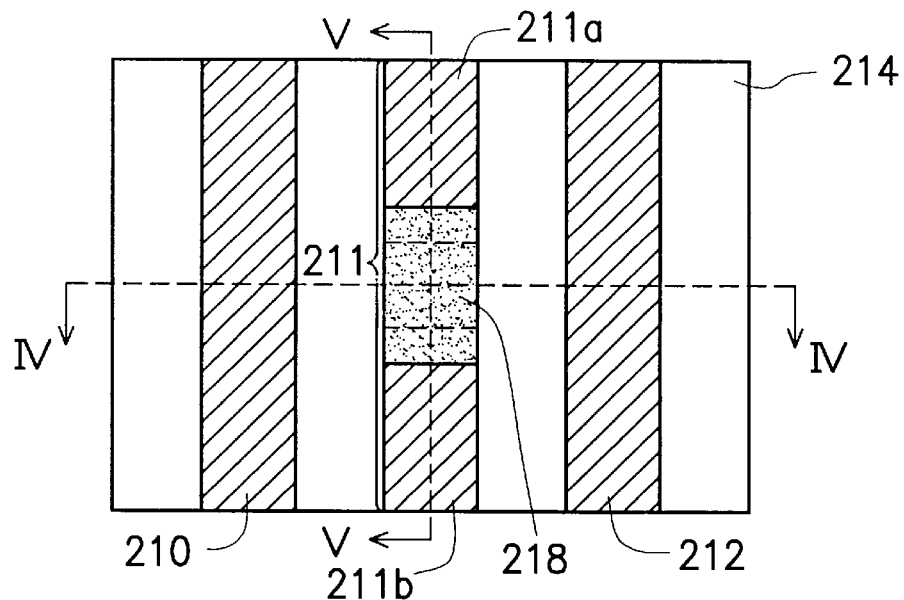
FIG. 2G is a top view of a layout of interconnects according to an embodiment of the invention.

FIGS. 2E–2F are cross-sectional views along dot line III—III of FIG. 2A illustrating a method of manufacturing interconnects according to the embodiment of the invention. FIG. 2G is a top view of portion of interconnects according to the embodiment of the invention.

Referring to FIG. 2E, a conductive layer (not shown), such as a copper layer, an aluminum layer and an aluminum-copper alloy layer, is formed over the substrate 200 and completely fills the trenches 206, 207a, 207b and 208. Then, part of the conductive layer is removed by, for example, chemical mechanical polishing, until the surface of the first dielectric layer 204 is exposed, thereby forming conductive lines 210, 211 and 212 as shown in FIGS. 2A and 2G. The conductive line 211 includes a first conductive section 211a and a second conductive section 211b which are separated by the coupling region 205 as part of the first dielectric layer 204.

Referring to FIG. 2F, a second dielectric layer 214 is formed on the first dielectric layer 204 and the conductive lines 210, 211 and 212 by, for example, chemical vapor deposition. Thereafter, the second dielectric layer 214 is planarized by, for example, chemical mechanical polishing until the thickness of the second dielectric layer 214 is approximately equal to the depth of a subsequently formed via hole.

A via hole 216a is formed by etching the second dielectric layer 214 to expose the coupling region 205 and an edge portion of each of the first conductive section 211a and the second conducive section 211b adjacent to the coupling region. A contact hole 216b is further formed by etching the coupling region 205 to expose the substrate 200.

Figure 2H:
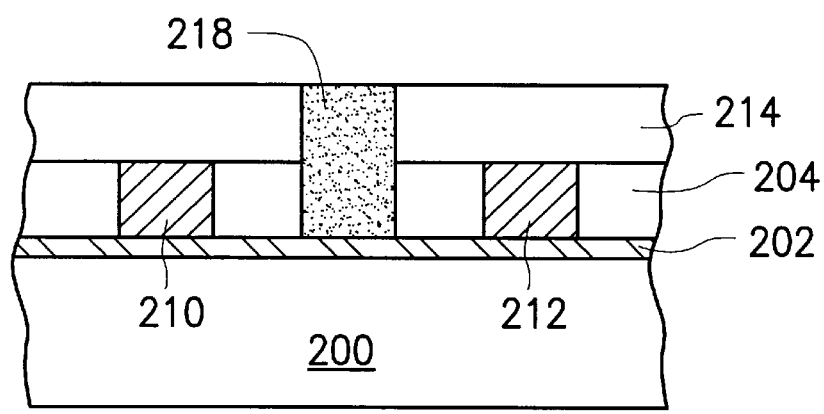
FIG. 2H is a cross-sectional view of FIG. 2G along dot line IV—IV.
Figure 2I:
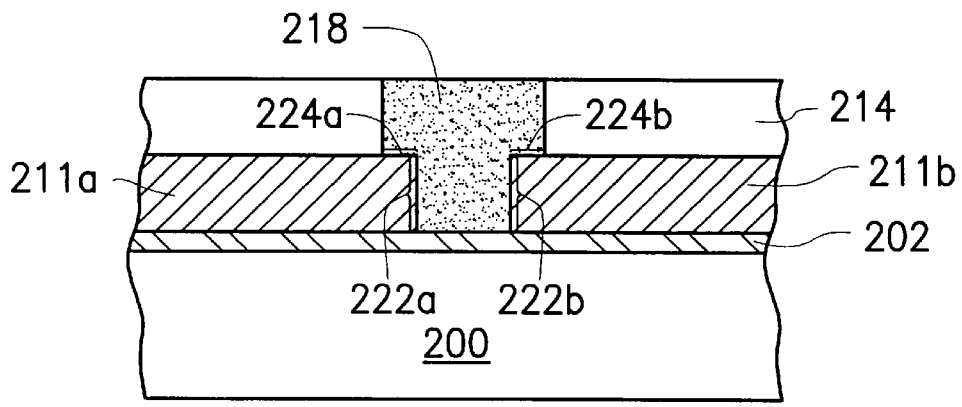
FIG. 2I is a cross-sectional view of FIG. 2G along dot line V—V.

FIG. 2H is a cross-sectional view of FIG. 2G along dot line IV—IV. FIG. 2I is a cross-sectional view of FIG. 2G along dot line V—V.

Referring to FIGS. 2G, 2H and 2I, a glue/barrier layer (not shown), such as a titanium/titanium nitride (Ti/TiN) layer or a tantalum/tantalum nitride (Ta/TaN) layer, is formed over the substrate and along the inner surfaces of the via hole 216a and the contact hole 216b to improve the adhesion to a subsequently-formed conductive layer. Then, a conductive layer (not shown), such as a tungsten layer, is deposited over the substrate 200 by, for example, chemical vapor deposition and fills the via hole 216a and the contact hole 216b. The portion of the conductive layer over the surface of the second dielectric layer 214 is removed by etch back or chemical mechanical polishing until the second dielectric layer 214 is exposed, so as to form a plug 218 filling the via hole 216a and the contact hole. The plug 218 is electrically connected to the conductive line 211 comprising both the first conductive section 211a and the second conductive section 211b.

In FIG. 2I, the plug 218 is electrically connected to the conductive section 211a by a direct contact with a side wall 222a and an edge portion of a top surface of the first conductive section 224a. Similarly, the plug 218 is simultaneously electrically connected to the conductive section 211b by a direct contact with the sidewall 224a and an edge portion of a top surface 224b.

Hence, according to the method of manufacturing interconnects of the invention, an opening circuit between the plug 218 and the conductive section 211 cannot occur. In addition, the contact area between the plug 218 and the conductive section 211 is greatly increased as compared to that in the prior art. As a result, the problem of the increased contact resistance between the plug 218 and the conductive section 211 is efficiently resolved.

In summary, the advantages of the invention are described as follows:

1. A conductive section with a coupling region therein is formed by a metal damascene process. A via hole just over the coupling region is formed in a dielectric layer, and then a coupling hoe is formed in the entire coupling region. Next, A plug is formed in the via hole and the coupling hole. Accordingly, an opening circuit between the conductive line and the plug can be efficiently prevented. In addition, the contact area between the conducive section and the plug is increased to greatly decrease the contact resistance therebetween since the plug extends inside the conductive section.

2. The method of manufacturing interconnects according to the invention is compatible with all current processes in semiconductor industry.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A method of manufacturing interconnects, comprising the steps of:
    providing a substrate having an insulating layer formed thereon;
    forming a first dielectric layer, which comprises at least a trench being divided into a first part and a second part by a coupling region on the insulating layer, wherein the coupling region constitutes a part of the first dielectric layer;
    filling the first part and the second part of the trench with a conductive layer so as to form a first conductive section and a second conductive section, respectively;
    forming a second dielectric layer to cover the first dielectric layer, the first conductive section, and the second conductive section:
    forming a via hole in the second dielectric layer to expose the coupling region and a portion of the first conductive section and the second conductive section adjacent to the coupling region;
    removing the coupling region exposed by the via hole to form a contact hole, the contact hole exposing sidewalls of the first and the second conductive sections under the via hole and having a smaller cross-sectional area than that of the via hole; and
    forming a plug to fill the via hole and the contact hole, the plug being in contact with both the first conductive section and the second conductive section.

2. The method as recited in claim 1, wherein the insulating layer comprises a silicon nitride layer functioning as an etch stop.

3. The method as recited in claim 1, wherein the first dielectric layer comprises a silicon oxide layer.

4. The method as recited in claim 1, wherein the material of forming the conductive layer is selected from the group consisting of copper, aluminum and aluminum-copper alloy.

5. The method as recited in claim 1, wherein the step of removing part of the first conductive layer is performed by chemical mechanical polishing.

6. The method as recited in claim 1, wherein the second dielectric layer comprises a silicon oxide layer.

7. The method as recited in claim 1, wherein the steps of forming the via hole and the contact hole is performed by anisotropic etching.

8. The method as recited in claim 1, wherein the plug comprises a tungsten layer.

9. The method as recited in claim 1, further comprising forming a tungsten/barrier layer on surfaces of the via hole and the contact hole before the plug is formed.

10. The method as recited in claim 9, wherein the glue/barrier layer is a titanium/titanium nitride layer or a tantalum/tantalum nitride layer.

11. A method of manufacturing interconnects, comprising the steps of:
    providing a substrate having an insulating layer formed thereon;
    forming a first dielectric layer on the insulating layer;
    patterning the first dielectric layer to form a plurality of trenches wherein at least one of the trenches is divided into a first part and a second part by a part of the first dielectric layer;
    filling the trenches with a first conductive layer, wherein the first conductive layer in the first part and the second part of the trench forms a first conductive section and the second conductive section, respectively;
    forming a second dielectric layer to cover the first dielectric layer and the first conductive layer;
    forming a via hole in the second dielectric layer to expose parts of top surfaces of the first conductive section and the second conductive section and the part of the first dielectric layer between the first and the second conductive sections;
    removing the part of the first dielectric layer between the first conductive section and the second conductive section until the insulating layer is exposed, thereby forming a contact hole;
    forming a plug in the via hole and the contact hole in the first and the second dielectric layer, respectively, wherein the plug is in contact with sidewalls and parts of top surfaces of the first conductive section and the second conductive section.

12. The method as recited in claim 11, wherein the insulating layer comprises a silicon nitride layer.

13. The method as recited in claim 11, wherein the first dielectric layer comprises a silicon oxide layer.

14. The method as recited in claim 1, wherein the step of removing part of the conductive layer is performed by chemical mechanical polishing.

15. The method as recited in claim 11, wherein the second dielectric layer comprises a silicon oxide layer.

16. The method as recited in claim 1, wherein the steps of forming the via hole and the contact hole are performed by anisotropic etching.

17. The method as recited in claim 1, wherein the step of forming the plug comprising:
    forming a second conductive layer on the first dielectric layer and the first conductive layer, wherein the conductive layer fills the via hole and the coupling hole; and
    removing part of the second conductive layer over the second dielectric layer and the first conductive layer until a surface of the second dielectric layer is exposed, thereby forming the plug in the via hole and the contact hole.

18. The method recited in claim 17, wherein the second conductive layer comprises a tungsten layer.

19. The method recited in claim 1, further comprising forming a glue/barrier layer on surfaces of the via hole and the contact hole before the plug is formed.

20. The method as recited in claim 19, wherein the blue/barrier layer is a titanium/titanium nitride layer or a tantalum/tantalum nitride layer.

* * * * *